US011739417B2

(12) United States Patent
Faucillon et al.

(10) Patent No.: US 11,739,417 B2
(45) Date of Patent: Aug. 29, 2023

(54) METHOD AND A DEVICE FOR AUTOMATICALLY DETERMINING ADJUSTMENT VALUES FOR OPERATING PARAMETERS OF A DEPOSITION LINE

(71) Applicant: SAINT-GOBAIN GLASS FRANCE, Courbevoie (FR)

(72) Inventors: Yohan Faucillon, Courbevoie (FR); Vojislav Gajic, Courbevoie (FR); Thierry Kauffmann, Courbevoie (FR); Etienne Sandre-Chardonnal, Nantes (FR)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 0 days.

(21) Appl. No.: 16/770,818

(22) PCT Filed: Dec. 7, 2018

(86) PCT No.: PCT/FR2018/053163
§ 371 (c)(1),
(2) Date: Jun. 8, 2020

(87) PCT Pub. No.: WO2019/110948
PCT Pub. Date: Jun. 13, 2019

(65) Prior Publication Data
US 2020/0392617 A1 Dec. 17, 2020

(30) Foreign Application Priority Data
Dec. 7, 2017 (FR) ........................................ 1761786

(51) Int. Cl.
*C23C 14/34* (2006.01)
*C23C 14/35* (2006.01)
(Continued)

(52) U.S. Cl.
CPC .......... *C23C 14/3492* (2013.01); *C23C 14/35* (2013.01); *C23C 14/547* (2013.01);
(Continued)

(58) Field of Classification Search
CPC ... C23C 14/3492; C23C 14/35; C23C 14/547; C23C 16/52; C23C 14/54; G05B 17/02;
(Continued)

(56) References Cited

U.S. PATENT DOCUMENTS 6,524,449 B1* 2/2003 Folta ....................... C23C 14/54
204/192.13
7,324,865 B1* 1/2008 Sonderman ............. C23C 14/34
438/5
(Continued)

FOREIGN PATENT DOCUMENTS

WO WO 01/90434 A2 11/2001
WO WO-0190434 A2 * 11/2001 ............. C25D 7/123
(Continued)

OTHER PUBLICATIONS

International Search Report as issued in International Patent Application No. PCT/FR2018/053163, dated Jan. 31, 2019.

*Primary Examiner* — Jennifer Wecker
*Assistant Examiner* — Patrick S Ott
(74) *Attorney, Agent, or Firm* — Pillsbury Winthrop Shaw Pittman LLP

(57) ABSTRACT

An adjustment-determining method includes obtaining a mathematical model relating an operating parameter of the deposition line to a quality function defined from a quality measurement of a stack of thin layers deposited by the deposition line on a transparent substrate; obtaining a value of the quality function from a value of the quality measurement measured at the outlet of the deposition line on a stack of thin layers deposited by the deposition line on a substrate (Continued)

while the deposition line was set so that an operating parameter had a current value; and automatically determining by the mathematical model an adjustment value for the current value of the operating parameter serving to reduce a difference that exists between the value obtained for the quality function and a target value selected for the quality function for the stack of thin layers.

16 Claims, 4 Drawing Sheets

(51) Int. Cl.
      *C23C 14/54*       (2006.01)
      *G05B 17/02*       (2006.01)
      *H01J 37/34*       (2006.01)

(52) U.S. Cl.
      CPC .......... *G05B 17/02* (2013.01); *H01J 37/3464* (2013.01); *H01J 2237/24592* (2013.01)

(58) Field of Classification Search
      CPC ........ H01J 37/3464; H01J 2237/24592; G01B 11/0625
      USPC .................. 204/298.03, 192.13; 427/8, 9, 10
      See application file for complete search history.

(56) References Cited

U.S. PATENT DOCUMENTS

| | | | | |
|---|---|---|---|---|
| 2005/0185174 | A1* | 8/2005 | Laan | G01N 21/4788 356/243.1 |
| 2009/0000950 | A1* | 1/2009 | Ortleb | C25D 5/22 205/84 |
| 2016/0130696 | A1* | 5/2016 | Price | C23C 14/22 427/10 |
| 2016/0161845 | A1* | 6/2016 | Bittner | G06F 30/398 716/52 |
| 2016/0362780 | A1* | 12/2016 | Van De Putte | H01J 37/32972 |
| 2018/0274086 | A1* | 9/2018 | Honda | C23C 14/545 |

FOREIGN PATENT DOCUMENTS

| | | | | |
|---|---|---|---|---|
| WO | WO 2016/110407 A1 | 7/2016 | | |
| WO | WO-2016110407 A1 * | 7/2016 | | C23C 14/547 |
| WO | WO 2017/061333 A1 | 4/2017 | | |

* cited by examiner

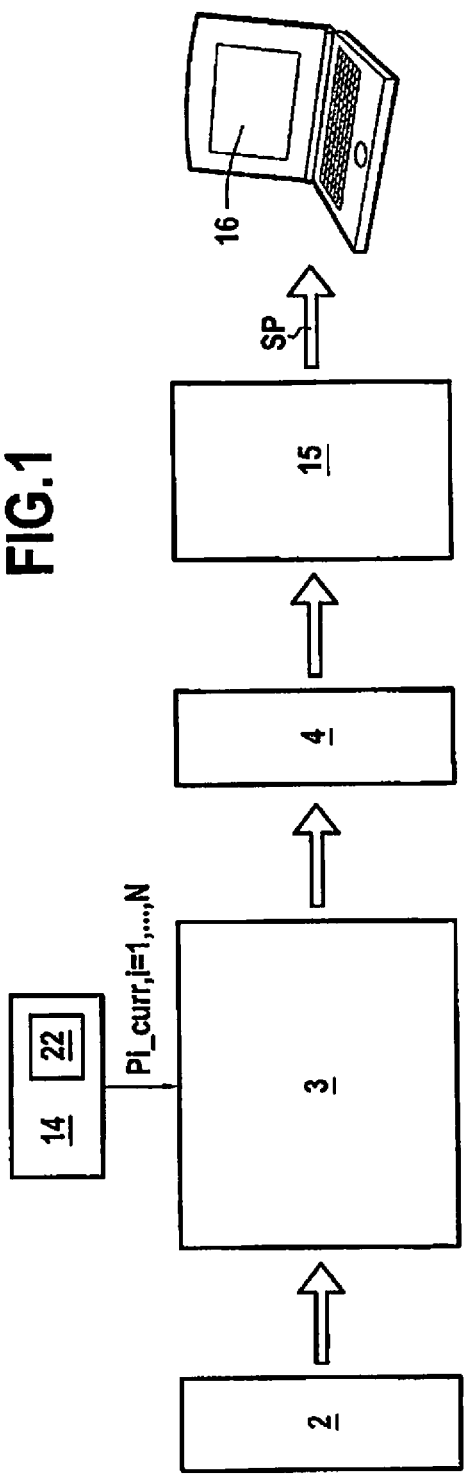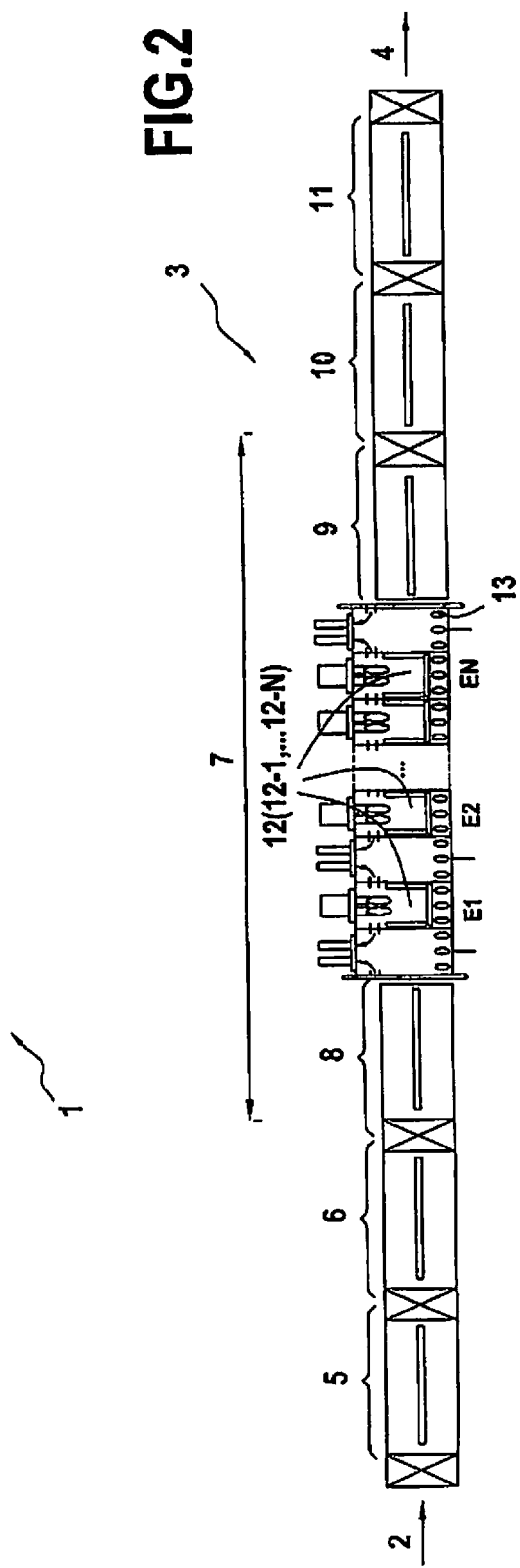

METHOD AND A DEVICE FOR AUTOMATICALLY DETERMINING ADJUSTMENT VALUES FOR OPERATING PARAMETERS OF A DEPOSITION LINE

CROSS-REFERENCE TO RELATED APPLICATIONS

This application is the U.S. National Stage of PCT/FR2018/053163, filed Dec. 7, 2018, which in turn claims priority to French patent application number 1761786 filed Dec. 7, 2017. The content of these applications are incorporated herein by reference in their entireties.

BACKGROUND OF THE INVENTION

The invention relates to fabricating transparent substrates coated on at least one face with a stack of thin layers, in particular transparent substrates made of glass or of polymeric organic material.

It is conventional to provide such transparent substrates with coatings that give them particular properties, in particular optical properties, e.g. for reflecting or absorbing radiation in a given wavelength range, electrical conduction properties, or indeed properties associated with ease of cleaning or with the possibility of the substrate being self-cleaning. Such coatings are generally stacks of thin layers based on inorganic compounds, in particular on metals, oxides, nitrides, or carbides. In the meaning of the invention, the term "thin layer" is used to designate a layer of thickness that is less than one micrometer, and generally lies in the range a few tens of nanometers to a few hundreds of nanometers (whence the term "thin").

A stack of thin layers is generally fabricated by depositing a succession of thin layers in a plurality of compartments of a deposition line (typically 20 to 30 compartments), these deposits being deposited in the various compartments by using one or more deposition methods such as, in particular: magnetic field assisted cathode sputtering (also referred to as magnetron cathode sputtering); ion beam assisted deposition (IBAD); evaporation; chemical vapor deposition (CVD); plasma enhanced CVD (PECVD); and/or low pressure CVD (LPCVD).

In order to optimize the quality of the final product as fabricated, it may be necessary to adjust the thicknesses of the thin layers deposited on the transparent substrate by the deposition line with considerable accuracy, typically to within better than 1%, and this needs to apply over the entire width of the stack of thin layers deposited on the substrate. This can be done by acting on various parameters of the fabrication process, and more particularly by adjusting the values of various operating parameters of the deposition line. By way of example, for a magnetron cathode sputtering deposition method, such operating parameters comprise the powers applied to the cathodes of the various compartments of the deposition line, the travel speed of the transparent substrate past each cathode, the pressure and/or the composition of the gas used in each compartment of the deposition line, etc. The parameters can thus be numerous and varied, and they may relate to some or all of the compartments of the deposition line. It can thus readily be understood that under certain circumstances (e.g. when the deposition line is of large size and has a large number of compartments), that such adjustment can be found to be complicated to implement and needs to be optimized.

Various solutions have already been proposed in the state of the art for performing such adjustment.

A first solution consists in adjusting layer by layer. The deposition line is set up and used so as to deposit only one layer of material on each pass of the substrate. Optical measurement apparatuses placed at the outlet of the deposition line then measure various spectrometric values (e.g. in transmission and/or in reception) at a plurality of points of the substrate on which the layer of material has been deposited, which points are distributed over the entire width of the slab. The measured spectrometric values are then compared with target values determined over the entire width of the slab for the layer of material under consideration by observing a stack of thin layers that is judged to be satisfactory. The operating parameters of the deposition line are then adjusted by trial and error in order to attempt to obtain the target spectrometric values that have been determined for the layer. That procedure (depositing, measuring, comparing with target values, and adjusting the deposition line) is reiterated for a given layer until the target values are obtained for that layer (to within a tolerance factor), and they are then repeated for each layer that is to be deposited on the substrate.

That first solution can therefore turn out to be extremely lengthy and tedious to perform, even when it is automated, since it is performed individually for each layer in order to adjust the operating parameters of the deposition line.

A second solution consists in having recourse to optical simulation software that relies on physically modeling the stack of thin layers deposited by the deposition line on the transparent substrate. The physical modeling takes account in particular of the thicknesses of the layers, of any gradients, of the physical characteristics of the materials used for the layers (in particular their refractive and absorption indices), etc. The optical simulation software is used for determining the "real" thicknesses of the stack of thin layers, and the operating parameters of the deposition line are then adjusted to cause those thicknesses determined by the optical simulation software to tend towards the target thickness values desired for the stack of thin layers.

Physically modeling a stack of thin layers is a task that is difficult, in particular when the number of layers is large and when great accuracy is expected (as applies for example when it is desired to make top-of-range products). Such modeling requires a very large number of measurements and is extremely expensive and time consuming.

A third solution proposed in the state of the art consists in relying on in-situ instrumentation: more particularly on the various optical measurement apparatuses (e.g. reflection and/or transmission spectrometer, ellipsometer) that are placed at various locations along the deposition line (within the deposition structure proper) so as to be able to take optical measurements on each layer deposited on the substrate. Target values for those optical measurements are also determined on the basis of a stack of thin layers that is judged to be satisfactory. Adjustments of the operating parameters of the deposition line are identified for the purpose of causing the values measured by the various optical measurement apparatuses positioned in the deposition line to tend towards those target values.

That approach having recourse to in-situ instrument presents several drawbacks.

Firstly, depending on the technology used by the deposition line, it can be difficult to perform. For example, when a deposition line makes use of magnetic field assisted (magnetron) cathode sputtering, it is extremely difficult to protect the optical measurement apparatuses from interfering deposits. As a result the optical measurement apparatuses become dirtied quickly, thereby significantly degrading the measurements those apparatuses deliver and not enabling the required accuracy to be obtained for the thicknesses of the layers in the stack deposited on the transparent substrate. Furthermore, that solution requires a large number of measurement apparatuses (apparatuses need to be arranged after each compartment of the deposition line and along the entire width of the slab), and it is therefore particularly expensive and difficult to implement.

There therefore exists a need for a method that makes it possible to adjust the operating parameters of a line for depositing a stack of thin layers on a transparent substrate and that does not present the drawbacks of the state of the art.

OBJECT AND SUMMARY OF THE INVENTION

The invention satisfies this need in particular by proposing an adjustment-determining method for automatically determining an adjustment value for at least one operating parameter of a deposition line for depositing a stack of thin layers on a transparent substrate, the method comprising:
  an obtaining step for obtaining a mathematical model relating at least one operating parameter of the deposition line to at least one predetermined quality function defined from at least one quality measurement of a stack of thin layers deposited by the deposition line;
  an obtaining step for obtaining a value of said at least one quality function from a value of said at least one quality measurement measured at the outlet of the deposition line on a stack of thin layers deposited by the deposition line on a transparent substrate while the deposition line was set so that at least one operating parameter had a "current" value; and
  an automatic adjustment-determining step for using the mathematical model as obtained to determine an adjustment value for the current value of said at least one operating parameter serving to reduce a difference that exists between the value obtained for said at least one quality function and a target value selected for said at least one quality function for the stack of thin layers.

Correspondingly, the invention also provides an adjustment-determining device for determining an adjustment value for at least one operating parameter of a deposition line for depositing a stack of thin layers on a transparent substrate, the device comprising:
  a first obtaining step, configured to obtain a mathematical model relating at least one operating parameter of the deposition line to at least one predetermined quality function defined from at least one quality measurement of a stack of thin layers deposited by the deposition line;
  a second obtaining module configured to obtain a value of said at least one quality function from a value of said at least one quality measurement measured at the outlet of the deposition line on a stack of thin layers deposited on a transparent substrate, said deposition line being configured by means of a "current" value for said at least one operating parameter; and
  an adjustment-determining module, configured to use a mathematical model as obtained to determine automatically an adjustment value for the current value of said at least one operating parameter serving to reduce a difference that exists between the value obtained for said at least one quality function and a target value selected for that at least one quality function for the stack of thin layers.

No limitation is associated with the technique used by the deposition line for depositing a stack of thin layers on the transparent substrate. Thus, by way of example, the deposition line may perform a magnetic field assisted cathode sputtering technique. In a variant, it may use an ion beam assisted deposition (IBAD) technique, an evaporation deposition technique, a chemical vapor deposition (CVD) technique, a plasma enhanced CVD (PECVD) technique, a low pressure CVD (LPCVD) technique, etc.

It should be observed that in the meaning of the invention a "value" may be constituted by a single component or it may designate a vector or a matrix comprising a plurality of components (e.g. when the values of a plurality of operating parameters are to be adjusted, typically one or more operating parameters for a plurality of compartments of the deposition line, or when a plurality of quality measurements are taken into consideration, typically at different points of the slab).

Likewise, in accordance with the invention, one or more quality measurements may be considered in the envisaged mathematical model. Those measurements may be considered individually, either raw or in modified form, or, where appropriate, they may be combined with one another by means of one or more mathematical functions (e.g. by means of an average). These various possible forms are taken into account in the meaning of the invention by the term "quality function".

The invention thus proposes a solution that is simple and novel compared with the state of the art for automatically adjusting the operating parameters of a line for depositing a stack of thin layers on a transparent substrate on the basis of quality measurements taken at the outlet from the deposition line on the complete stack of thin layers that it has deposited. These quality measurements serve to determine the extent to which the stack of thin layers deposited by the deposition line satisfies target characteristics that it is desired it should satisfy. The solution proposed by the invention relies on a simplified mathematical model relating the operating parameters of the deposition line to the quality measurements taken at the outlet of this line on the stack of thin layers deposited on the substrate. In practice, such a mathematical model is much more robust and easy to determine than a physical model of the stack as proposed in the state of the art, which on the contrary is a non-linear model requiring numerous physical measurements in order to be established. On the contrary, in the invention, the model under consideration is a mathematical model that does not seek to rely, properly speaking, on physical realities, and as a result, it is more robust against errors (because of the very nature of the model). Furthermore, depending on the selections made, the mathematical model may have many fewer coefficients for estimating than would a physical model, and its nature (e.g. a linear model or more generally a polynomial model, etc.) is a priori independent of the number of layers and/or of the materials used for the stack. Such a mathematical model may also be determined easily by training from a reference data set established while taking into consideration a reasonable number of previously-deposited stacks (deposited either in accordance with a dedicated experimental design or else during preceding production runs); it can also be updated easily.

An advantage of the invention lies in adjusting fabrication parameters for a plurality of sensitive thin layers.

The person skilled in the art knows that the characteristics of a layer, in particular its thickness or its stoichiometry, can vary as a result of variation in parameters that are not adjustable, e.g. because of a reduction in the thickness of the target. Thin layers having tolerances that are smaller than the variability of the characteristics of the layer due to those non-adjustable parameters can in particular be considered as being sensitive layers.

The invention may in particular be implemented as follows:
  making a first stack of thin layers with parameters that are clearly understood will lead to a stack being obtained that has properties that are not satisfactory; and
  taking one or more measurements, but only at the outlet from the deposition line, and adjusting the fabrication parameters of a plurality of layers, in particular of sensitive layers, as a function of the result of the measurements, so as to obtain a stack having properties that are satisfactory at the end of the following iteration of the method, or after several iterations.

Consequently, the invention provides a considerable saving in time compared with the existing state of the art for adjusting operating parameters of a deposition line. Furthermore, this is made possible by the invention without requiring partial stacks to be made, and without having recourse to in-situ instrumentation that is expensive and difficult to maintain. Nevertheless, the adjustment values for the operating parameters of the deposition line as supplied by the invention are accurate and they enable the specifications that are desired for the resulting stack of thin layers to be achieved quickly.

The adjustment method proposed by the invention relies advantageously on measurement apparatuses that are already present at the outlet of a deposition line, and that are particularly robust. By way of example, such measurement apparatuses are spectrometers and/or ellipsometers that serve to obtain quality measurements of the complete stack of thin layers, and more precisely optical spectrum measurements (e.g. in transmission and/or in reflection, at an angle of 0° or at other angles (e.g. 60°)), and/or ellipsometric values.

In addition to optical measurements, said at least one quality measurement taken into account by the mathematical model may equally well comprise at least one of the following measurements:
  measuring an electrical property of the stack of thin layers (e.g. its electrical resistance);
  measuring a mechanical property of the stack of thin layers (e.g. its mechanical strength);
  measuring a chemical property of the stack of thin layers (e.g. its chemical resistance); and
  measuring a weight property of the stack of thin layers.

Naturally, these examples are given purely by way of illustration, and other measurements could be considered in the mathematical model in addition to the above-mentioned quality measurements. In particular, it is possible to consider not only quality measurements taken on the complete stack, but also other measurements taken on a partial stack, e.g. by means of in-situ instrumentation provided in one or more compartments of the deposition line.

Likewise, the operating parameters of the deposition line that can be adjusted by means of the invention may be of various kinds. Thus, in a particular implementation in which the deposition line comprises a plurality of compartments in which said thin layers are deposited on the transparent substrate, said at least one operating parameter may comprise:
  at least one power or voltage applied to a cathode of a said compartment of the deposition line; and/or
  at least one travel speed of the substrate past a cathode of a said compartment of a deposition line; and/or
  at least one pressure and/or quantity of gas used in a said compartment of the deposition line; and/or
  at least one magnetic field or magnetic field distribution applied in a said compartment of the deposition line; and/or
  at least one adjustment of a mechanical element of a said compartment of the deposition line.

Naturally, said list is not exhaustive and other operating parameters may be considered.

No limitation is associated with the type of mathematical model used by the invention. In particular, it may be a linear model that is very simple to implement, or it may be a polynomial model that is more complex (e.g. of second or third order), or indeed it may be a model determined via a statistical training algorithm such as a linear regression algorithm (e.g. ridge regression, LASSO regression, or support vector regression (SVR), an algorithm using a neural network or decision trees (e.g. the random forest algorithm), a training algorithm using reinforcement or interpolation (e.g. the Gaussian process algorithm or the nearest neighbor algorithm), etc.).

In a particular implementation, the mathematical model used by the invention relates at least one variation of said at least one operating parameter to at least one variation of said at least one quality function.

Such a model, which sets out to consider variations in the operating parameters and variations in the quality function(s), serves to avoid noise or bias that might result from various "hidden" parameters, such as for example the conditions under which the various quality measurements are acquired, which conditions may differ between the stack under consideration during adjustment and the reference stack considered in the training set for the mathematical model, or errors or drifts presented by the measurement apparatuses used for acquiring the quality measurements at the outlet from the deposition line (e.g. by optical sensors), or indeed slow drifts affecting the deposition line (e.g. associated with the age of the cathodes used in the compartments, etc.).

In order to determine the mathematical model used by the invention, the obtaining step (in other words the step of training the mathematical model) may comprise, by way of example:
  obtaining a "reference" value for said at least one operating parameter corresponding to a setting of the deposition line while performing a "reference" deposition of a stack of thin layers on a substrate;
  for a plurality of "training" stacks of thin layers deposited by the deposition line on a substrate while said deposition line is set with said values of said at least one operating parameter presenting determined variations relative to said reference value, obtaining a plurality of values for said at least one quality function; and
  a step of determining the mathematical model from the plurality of values for said at least one quality function as obtained for the plurality of training stacks of thin layers.

Various strategies may be used for selecting the training stack of thin layers.

By way of example, it is possible to define an experimental design that is dedicated specifically to determining the mathematical model. In the experimental design, it is possible by way of example to select variations for the values of the operating parameters that make it possible to guarantee the linear assumption made for the mathematical model (e.g. +10% or −10% relative to the reference values), and the parameters of the deposition line are set as often as necessary with operating parameters that are adjusted using the selected variations. In this way, the training stacks of layers are limited to a reasonable number and they are limited to training stacks of layers that are pertinent (typically about fifteen) for obtaining a model that is reliable. It should be observed that the training stacks may be made by the deposition line following one another immediately, or they may be made at greater time intervals. Such an experimental design is particularly pertinent when it is desired to determine the mathematical model by deterministic calculation, where such calculation is of complexity that is linked directly to the numbers of training stacks that are taken into consideration.

In a variant, another approach may consist in taking into consideration various training stacks that have already been made by the deposition line, which stacks are taken in "random" manner from uses of the deposition line, and then making use of information that is available about those stacks (quality measurements and associated operating parameters of the deposition line) in order to determine the mathematical model. This makes much more information available for determining the mathematical model. Nevertheless, since the stacks in question were not made specifically in the context of a pre-established experimental design dedicated to determining the model, they are preferably filtered so as to make the model by taking, from amongst all of the available data, data that does not include outliers (associated with errors in the sensors, for example), or data from stacks that present anomalies (e.g. stacks not having the proper composition). It is also possible to envisage retaining only data that corresponds to stacks presenting variations relative to the reference values for the operating parameters that lie within a determined range of variations (e.g. in a range of variations of ±15% about a reference value). It is also possible to ensure that the training stacks used have a uniform distribution over the range of variations (eliminating outliers); as a result, fewer training stacks are needed for establishing the mathematical model (e.g. 40 stacks).

Training stack selection may be associated with other conditions that seek to ensure compatibility among the training stacks, such as for example conditions concerning the date at which the stacks were deposited, etc.

This approach, without an experimental design, is particularly applicable when the mathematical model is determined using a statistical algorithm. It also enables the mathematical model in use to be updated more easily and more often.

As mentioned above, various mathematical models can be envisaged in the context of the invention for relating the operating parameters to the quality function. Furthermore, these mathematical models may equally well supply values for the quality function as a function of values for the operating parameters (which models are referred to as "direct" models in the description below), or conversely they may supply values for the operating parameters as a function of values for the quality function (which models are referred to as "indirect" models in the description below).

In an implementation, after being subjected to the series of measurements at the outlet from the deposition line, the stack of thin layers is to be subjected to some other treatment, referred to as "subsequent" treatment (e.g. thermal quenching, lamination, or double glazing). An object of the invention may be to obtain a final product having properties that are satisfactory after that subsequent treatment and thus to adjust the operating parameters in such a manner that desired properties are presented by the final product (as contrasted with the stack of thin layers at the outlet from the deposition line). This implementation of the invention thus seeks to minimize the difference between the current value of the quality function and the value of the quality function as measured at the outlet from the deposition line for a product having properties that are judged to be satisfactory after subsequent treatment.

In practice, the properties of the final product can be related to measurements taken at the outlet from the deposition line, e.g. by an automatic statistical training mechanism. In an implementation, the quality function is determined to take this relationship into account.

In an implementation of the invention, the quality function is selected to represent certain characteristics of the stack of thin layers that are not easily measurable at the outlet from the line. This may apply to thermal characteristics that take a long time to measure. Consequently, and in more general manner, in an implementation of the invention, the vector or the matrix representing the quality function may have one or more components that are not measurements, but that are transformations of such measurements. Such a transformation may in particular be: a transformation enabling a property that is difficult to measure to be predicted as a function of a property that is easy to measure; and/or a transformation making it possible to predict a property after subsequent treatment.

When a direct mathematical model is used, the model needs to be inverted, and as a result a plurality of iterations might be required in order to converge on a target value selected for the quality function; in other words, a plurality of successive adjustments of the operating parameters might be needed. Nevertheless, this convergence is fairly fast and in practice only a few iterations suffice. In addition, using such a direct model is more intuitive, since it models the behavior of the stack of thin layers that has been deposited as a function of the parameter settings of the deposition line. It is thus simpler to interpret from a physical point of view since it serves to identify how the settings of the parameters of the deposition line influence the properties of the deposited stack of thin layers.

In contrast, using an indirect model makes it possible to obtain directly the adjustment values for application to the deposition line in order to obtain the target values for the quality function, i.e. to obtain them without proceeding with optimization proper, and thus without requiring the model to be inverted. As a result, such a model is simpler to use for determining the adjustment values.

In a particular implementation:
the mathematical model is a ("direct") polynomial model supplying variations to the value of said at least one quality function as a function of variations in the value of said at least one operating parameter; and
the adjustment-determining step includes a step of inverting the polynomial model in order to determine said adjustment values.

The inversion step may also include regularizing the inversion of the polynomial model using known techniques in order to improve the robustness of the model, e.g. by using Tikhonov or LASSO regularization. Such regularization serves to distinguish better between the various layers of the stack of thin layers.

The inventors have observed that a simple polynomial model such as a linear model suffices for obtaining good results in terms of adjustment. This applies for example when determining optical spectrum variations as a function of power variations to be applied to the cathodes of a deposition line using a magnetron cathode sputtering technique.

Such a polynomial model (and a fortiori a linear model) presents the advantage of being very simple to determine; specifically it has few coefficients to be estimated and it is particularly robust. In addition, when the model used is a linear model, it may be represented in the form of a matrix that is easy to manipulate, thereby making it possible to derive the adjustment values by calculation that is deterministic.

Thus, more particularly, in a particular implementation, the deposition line has N compartments, N being an integer greater than 1, each compartment being associated with a respective operating parameter P(n), n=1, ..., N, and the mathematical model is a linear model using a matrix written M and comprising N columns u(n), each column being defined by:

$$u(n) = \frac{1}{2 \times \delta(n)} \text{var}(n)$$

where var(n) designates the difference between the values of said at least one quality function obtained for two training stacks of thin layers deposited by the deposition line while it was set with a value for the operating parameter P(n) presenting a variation +δ(n) relative to the reference value for the operating parameter P(n) and to a value of the operating parameter P(n) presenting a variation −δ(n) relative to the reference value for the operating parameter P(n).

In this implementation, the adjustment value, written a, for said at least one operating parameter serves to reduce the difference that exists between the value obtained for said at least one quality function and its selected target value is given by way of example by:

$$a = (M^T M)^{-1} M^T v$$

where v designates the difference between the value obtained for the quality function and the target value selected for said quality function for the stack of thin layers, and where $M^T$ designates the transpose of the matrix M.

As mentioned above, in a particular implementation, the mathematical model used by the invention is obtained by using an automatic statistical training algorithm.

As mentioned above, the advantage of using a statistical training algorithm is that it makes it possible to establish the mathematical model from "random" stacks of thin layers made by the deposition line, and for which quality measurements are available in association with the operating parameters with which the deposition line was configured when making those stacks. This makes it possible to avoid using an experimental design dedicated to constructing the mathematical model, and to make use, advantageously, of information that is already available, and that was not necessarily generated for this purpose.

In a particular implementation, the adjustment-determining method further includes a step of validating the mathematical model that is obtained.

Such validation may be performed automatically or manually by an operator, e.g. by observing a set of validation stacks of thin layers selected for performing the validation, and by comparing the layers that need to be adjusted with the layers identified by the mathematical model (i.e. for which the mathematical model gives non-zero adjustment values for the operating parameters associated with those layers).

Naturally, if at the end of this validation step, the mathematical model is considered as not being valid, then a new mathematical model is determined, e.g. from another set of training stacks, or from a filtered set of training stacks in which data relating to stacks that present anomalies or outlier data have been removed.

In a particular implementation, the various steps of the adjustment-determining method are determined by computer program instructions.

Consequently, the invention also provides a computer program on a data medium, the program being suitable for being performed in an adjustment-determining device or more generally in a computer, the program including instructions adapted to perform steps of an adjustment-determining method as described above.

The program may use any programming language or be in the form of source code, object code, or code intermediate between source code and object code, such as in a partially compiled form, or in any other desirable form.

The invention also provides a computer-readable data or recording medium that includes instructions of a computer program as mentioned above.

The data or recording medium may be any entity or device capable of storing the program. For example, the medium may comprise storage means, such as a read only memory (ROM), e.g. a compact disk (CD) ROM, or a microelectronic circuit ROM, or indeed magnetic recording means, e.g. a floppy disk or a hard disk.

Furthermore, the data or recording medium may be a transmissible medium such as an electrical or optical signal, which may be conveyed via an electrical or optical cable, by radio, or by other means. The program of the invention may in particular be downloaded from an Internet type network.

Alternatively, the data or recording medium may be an integrated circuit in which the program is incorporated, the circuit being adapted to execute or to be used in the execution of the method in question.

The invention also provides a parameter-setting method for setting parameters of a deposition line suitable for depositing a stack of thin layers on a substrate, the method comprising:

a first parameter-setting step for setting at least one operating parameter of the deposition line with a "current" value;

a deposition step of the deposition line set with said current value depositing a stack of thin layers on a substrate;

an adjustment-determining step determining an adjustment value for the current value of said at least one operating parameter by performing an adjustment-determining method of the invention and by using a value for said at least one quality measurement as measured at the outlet of the deposition line on the stack of thin layers deposited during the deposition step;

an estimation step for estimating an adjusted value for said at least one operating parameter from the current value and from the determined adjustment value; and a second parameter-setting step for setting at least one operating parameter of the deposition line with the adjusted value as estimated during the estimation step.

Correspondingly, the invention also provides a deposition system for depositing a stack of thin layers on a transparent substrate, the system comprising:

a deposition line suitable for depositing a stack of thin layers on a transparent substrate;

a parameter-setting module configured to set at least one operating parameter of the deposition line with a "current" value;

an adjustment-determining device of the invention determining an adjustment value for the current value of said at least one operating parameter configured to use a value of at least one quality measurement measured at the outlet of the deposition line on a stack of thin layers deposited on the transparent substrate by the deposition line; and an estimator module configured to estimate an adjusted value for said at least one operating parameter from the current value and from the adjustment value determined by the adjustment-determining device;

the parameter-setting module being configured to set at least one operating parameter of the deposition line with the adjusted value as estimated by the estimator module.

The parameter-setting method and the deposition system of the invention benefit from the same advantages as those set out above for the adjustment-determining method and device.

In a particular implementation, the deposition, adjustment determining, adjustment, and second parameter-setting steps of the parameter-setting method are performed so long as:

the difference between the value of said at least one quality function estimated from said measured value at the outlet from the deposition line and the target value selected for said at least one quality function is greater than a predetermined threshold, or the adjustment value determined for said at least one operating parameter is less than a predetermined threshold.

The value of a quality function may be represented by a vector or by a matrix.

In a first implementation, the above difference is a distance (between two vectors or two matrices) and the threshold is a real value.

In another implementation, the difference between two vectors is a vector and the difference between two matrices is a matrix, and the threshold is an element of the same kind. For example, with vectors and in equivalent manner with matrices, it is considered that the difference between two vectors is less than a threshold vector if the absolute value of each component of the difference vector is less than the components of the threshold vector. This implementation gives greater flexibility since it is possible to set the components of the threshold vector differently in order to give more importance to certain characteristics, and in particular to those that are associated with the specifications of the product.

The first condition makes it possible to ensure convergence on the target value for said at least one quality function, while avoiding performing pointless iterations. The second condition serves to ensure that the adjustment value as determined is not an outlier in the light of expert criteria (in particular as a function of which the predetermined threshold is set). This second condition may also serve to force the adjustment value to comply with certain criteria (e.g. to lie within certain ranges of values in order to guarantee certain properties for the substrate covered in the stack of thin layers).

In other implementations, it is also possible to envisage that the adjustment-determining method, the adjustment-determining device, the parameter-setting method, and the deposition system of the invention present in combination all or some of the above-mentioned characteristics.

BRIEF DESCRIPTION OF THE DRAWINGS

Other characteristics and advantages of the present invention appear from the following description made with reference to the accompanying drawings, which show an embodiment having no limiting character. In the figures:

FIG. 1 is a diagram of a particular embodiment of a deposition system in accordance with the invention shown in its environment;

FIG. 2 shows the deposition line of the FIG. 1 deposition system;

DETAILED DESCRIPTION OF THE INVENTION

Figure 3:
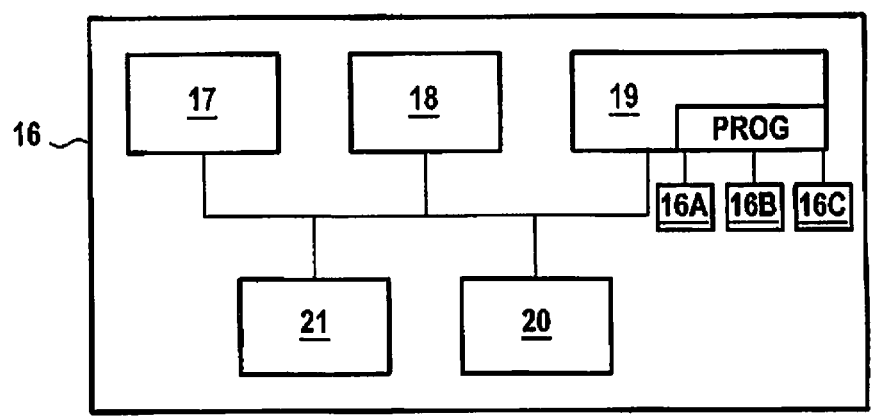
FIG. 3 is a diagram showing the hardware architecture of an estimator device of the FIG. 1 deposition system in accordance with the invention and configured to determine adjustment values for operating parameters of the FIG. 2 deposition line.

FIG. 1 shows, in its environment, a particular embodiment of a deposition system 1 in accordance with the invention for use in depositing a stack of thin layers on a transparent substrate 2 by means of a deposition line 3. The deposition system 1 serves advantageously to set the parameters of the deposition line 3 appropriately for ensuring that the stack of thin layers corresponds to predetermined target characteristics.

By way of illustration, in the example shown in FIG. 1, the transparent substrate 2 is a glass substrate having a thickness of 6 millimeters (mm) having a stack of thin layers deposited thereon, the stack comprising a plurality of functional thin layers suitable for acting on solar radiation (specifically in this example two silver layers referenced Ag1 and Ag2), and coatings formed by one or more thin layers situated on either side of each functional layer. Below, the term "module" (M1, M2, M3) is used to designate each of the coatings on either side of the functional silver layers, it being understood that a module may be constituted by a single thin layer or by a plurality of thin layers. In the meaning of the invention, the term "thin layer" is used to mean a layer of thickness that is less than one micrometer and that generally lies in the range a few tens of nanometers to a few hundreds of nanometers (whence the term "thin").

In the example shown in FIG. 1 (referred to below was EX1), the stack of thin layers is constituted in succession from the substrate 2 by:

a module M1 constituted by a thin layer of silicon nitride ($Si_3N_4$) having a thickness of 14.5 nanometers (nm) and a thin layer of zinc oxide (ZnO) having a thickness of 6 nm:

a silver thin layer Ag1 having a thickness of 5.5 nm;

a module M2 constituted by a blocking thin layer made of chromium and nickel alloy (NiCr) having a thickness of 0.6 nm, a thin layer of zinc oxide (ZnO) having a thickness of 6 nm, a thin layer of silicon nitride ($Si_3N_4$) having a thickness of 34 nm, and a thin layer of niobium nitride (NbN) having a thickness of 1 nm, a thin layer of silicon nitride ($Si_3N_4$) having a thickness of 34 nm, and a thin layer of zinc oxide (ZnO) having a thickness of 5 nm;

a silver thin layer Ag2 having a thickness of 17 nm; and
a module M3 constituted by a blocking thin layer of nickel and chromium alloy (NiCr) having a thickness of 1 nm, a thin layer of zinc oxide (ZnO) having a thickness of 5 nm, a thin layer of silicon nitride ($Si_3N_4$) having a thickness of 23 nm, and a thin layer of zinc and tin oxide (SnZnO) having a thickness of 5 nm.

Naturally, this example EX1 is not in any way limiting and it is possible to envisage other stacks of thin layers with other thicknesses and other transparent substrates (e.g. substrates made of polymeric organic material that may be flexible or rigid).

In the embodiment shown in FIG. 1, the deposition line 3 used for depositing the stack of thin layers on the transparent substrate 2 performs a magnetic field assisted cathode sputtering technique, also referred to as magnetron cathode sputtering. The glass substrate coated in the stack of thin layers deposited by the deposition line 3 (sometimes referred to herein as the "slab") is given reference 4 below.

In known manner, a cathode sputtering techniques relies on condensing on a substrate a vapor of a target material obtained from a sputtering source, the condensation taking place within a rarefied atmosphere. More precisely, atoms from the source (also referred as the "target") are ejected into an ionized gas, such as argon for example, within an evacuated enclosure that is maintained at a certain pressure. An electric field is created, thereby leading to the gas being ionized, and thus forming a plasma. The target is raised to a negative potential (cathode) so that ions present in the plasma are attracted by the target and they eject atoms therefrom. The particles sputtered in this way are diffused within the enclosure and some of them are picked up in particular on the substrate they form a thin layer. With a magnetron cathode, a magnetic field that is oriented perpendicularly to the electric field is also created by magnets that are placed in the proximity of the cathode so as to confine the electrons to the vicinity of the cathode. This serves to increase the extent to which the gas is ionized, and thereby improve significantly the deposition yield compared with a conventional cathode sputtering technique. Since cathode sputtering techniques are known to the person skilled in the art, they are not described in greater detail herein.

FIG. 2 is a diagram of the deposition line 3 used for depositing thin layers on the glass substrate 2 by cathode sputtering. In this example it comprises an inlet chamber 5, a first buffer chamber 6, a magnetron cathode sputtering chamber 7 including a first transfer section 8 and a second transfer section 9, a second buffer chamber 10, and an outlet chamber 11.

In addition to the two transfer sections 8 and 9, the cathode sputtering chamber 7 comprises a succession of elements Ei, i=1, . . . , N, where N is an integer greater than 1. Each element Ei comprises a deposition chamber of compartment 12-$i$ containing a cathode used as a target during magnetron cathode sputtering, and possibly also one or two pumping chambers or compartments having respective pumps, and located, if any, on either side of the deposition chamber in order to create a vacuum therein. The glass substrate 2 travels through the various successive compartments of the cathode sputtering chamber 7, being driven by a roller bed or conveyor 13.

The succession of the various elements Ei, i=1, . . . , N enables a stack of thin layers to be deposited on the glass substrate 2, in other words, in above-described example EX1, it enables the two functional silver layers Ag1 and Ag2 to be deposited together with thin layers constituting the three modules M1, M2, and M3. It should be observed that a plurality of successive compartments 12-$i$ can contribute to depositing a thin layer of a single material, in predefined proportions. Nevertheless, in the presently-envisaged example, for reasons of simplification, it is assumed that any one thin layer of material is deposited in a single compartment of the deposition line.

The parameters of the various compartments 12-$i$ in which the thin layers are deposited may be set by adjusting various parameters of the magnetron cathode sputtering, and in particular the pressure of the gas, its quantity and composition, the power applied to the cathode in the compartment under consideration, the angle of incidence of the bombarding particles and the magnetic field applied in this compartment, the travel speed of the glass substrate past the cathode, etc. These adjustments are carried out in such a manner as to obtain, at the outlet from the deposition line, a stack of thin layers that comply with one or more target properties (e.g. mechanical and/or optical properties) that are desired for the stack. Compliance with these properties is ensured once the deposited thin layers comply with certain thickness specifications to within predetermined tolerance.

The various above-mentioned parameters constitute operating parameters of the deposition line 3 in the meaning of the invention that are suitable for being adjusted in full or in part by means of the invention by using a parameter-setting module 14 of the deposition system 1 that is provided for this purpose and that uses operating parameter adjustment values that are determined by means of the invention. The term "current" is used to qualify the operating parameters with which the deposition line 3 is configured by the parameter-setting module 14 and that the line applies in order to deposit a stack of thin layers on a transparent substrate while the transparent substrate is passing through the compartments of the line.

It should be observed that other operating parameters of the deposition line 3 may be adjusted while the deposition line 3 is in use, such as for example adjustments of mechanical elements of the compartments 12-$i$ of the deposition line 3, such as the positions of metal masks that are provided within the compartments in order to limit the depositing of thin layers performed on the substrate, the positions of actuators for moving the magnets placed in the proximity of the cathode, etc. The invention may also be applied to operating parameters of this type in the deposition line.

There is thus no limitation is thus associated with the nature of the operating parameters of the deposition line to which the invention can be applied. Nevertheless, in the description below, and in order to simplify describing the invention, attention is given to setting and adjusting powers, written Pi, i=1, . . . , N, for the cathodes in each of the compartments 12-$i$, i=1, . . . , N of the deposition line 3.

In order to make this adjustment possible, the deposition system 1 in this example has one or more systems 15 for inspecting the qualities of the stacks of thin layers as deposited by the deposition line 3. This or these inspection systems are placed at the outlet from the deposition line 3 so as to provide measurements of the quality of the complete stacks of thin layers as deposited by the deposition line 3.

In the embodiment shown in FIG. 1, and for simplification purposes, consideration is given to a single optical inspection system 15, such as for example a spectrometer, that is suitable for obtaining and supplying optical spectrum measurements taken on the complete stack of thin layers as deposited by the deposition line 3 on the glass substrate 2 at various measurement points distributed across the width of the substrate. The optical spectrum measurements are referred to in general manner below in the description by SP.

Each optical spectrum SPj, j=1, ..., J (where J designates an integer greater than 1) as measured by the optical inspection system 15 at a determined measurement point provides a plurality of spectrum values measured at a plurality of wavelengths (e.g. K wavelengths, where K is an integer greater than 1): each optical spectrum SPj can thus be represented in the form of a vector of spectrum values, each spectrum value corresponding to a given wavelength.

In the description below, the vectors are represented by convention in a column representation.

No limitation is associated with the types of optical spectra that can be measured by the optical inspection system 15: the optical inspection system 15 can measure one or more optical spectra, typically at various points of the stack of thin layers deposited by the deposition line 3 (i.e. over its entire width and its entire length), taking measurements in transmission and/or in reception, on the stack side and/on the substrate side, at various angles (e.g. at an angle of 0° and/or of 60°), etc. Such an optical inspection system is itself known and is conventionally used at the outlet from a deposition line. It is not described in greater detail herein. Herein, and where necessary, the integer J takes account of the various types of optical spectra that are measured and/or of the various measurement points where the optical spectra are measured.

In a variant, other types of inspection system 15 may be placed at the outlet from the deposition line 3 in order to acquire measurements of the quantity of the stack of thin layers as deposited by the deposition line 3 on the glass substrate 2. Such other optical inspection systems may involve ellipsometers, or inspection systems that serve to acquire quality measurements of other kinds, such as for example measurements of an electrical property of the stack of thin layers (e.g. its electrical resistance), measurements of a mechanical property of the stack of thin layers (e.g. its mechanical strength), measurements of a chemical property of the stack of thin layers (e.g. its chemical resistance), or indeed measurements of a weight property of the stack of thin layers.

In the context of the invention, in addition to the quality measurements supplied by the inspection system 15 placed at the outlet from the deposition line 3, it is also possible to take into consideration measurements taken on a partial stack as collected by in-situ instrumentation provided in one or more compartments of the deposition line 3.

The quality measurements taken by the inspection system 15 on the complete stack deposited on the glass substrate 2 are supplied to an adjustment-determining device 16 of the system 1 in accordance with the invention that is configured to determine the adjustment values for the current operating parameters with which the deposition line 3 is configured in the light of the quality of the stack of thin layers that has been subjected to quality measurements. These adjustment values are subsequently supplied to the parameter-setting module 14 so that some or all of the operating parameters of the deposition line 3 can be modified, where appropriate, in order to reach, or at least approach as closely as possible, the target characteristics desired for the stacks of thin layers made by the deposition line.

In the presently-described embodiment, the adjustment-determining device 16 is a computer having hardware architecture as shown diagrammatically in FIG. 3. It comprises a processor 17, a random access memory (RAM) 18, a ROM 19, a non-volatile memory 20, and a communication module 21.

The communication module 21 enables the adjustment-determining device 16 to obtain the quality measurements taken by the inspection system 15 (optical spectrum measurements in the presently-described example) on a stack of thin layers deposited by the deposition line 3, and to communicate with the parameter-setting module 14 of the deposition line 3 in order to provide it with adjustment values to be applied to the current operating parameters with which the deposition line 3 is configured. In particular, the communication module 21 may comprise a digital data bus and/or means for communicating over a network (local or wide-area) such as for example a network card, etc., depending on the way in which the optical inspection system 15, the parameter-setting module 14, and the adjustment-determining device 16 are interconnected. In the presently-described embodiment, it is assumed that the parameter-setting module 14 also includes an estimator module 22 configured to estimate adjustment values of the current operating parameters of the deposition line 3 from current values with which the deposition line 3 is configured and adjustment values as determined and supplied by the adjustment-determining device 16.

The ROM 19 of the adjustment-determining device 16 constitutes a data medium in accordance with the invention that is readable by the processor 17 and that stores a computer program PROG in accordance with the invention including instructions for executing steps of a locating method of the invention.

In equivalent manner, the computer program PROG defines functional and software modules configured in this example to perform the steps of the adjustment-determining method of the invention. These functional modules rely on or control the above-mentioned hardware elements 17 to 21. In particular, in this example, they comprise:

- a first obtaining module 16A configured to obtain a mathematical model, referenced MOD, relating at least one operating parameter of the deposition line 3 to at least one predetermined quality function defined on the basis of at least one quality measurement supplied by the inspection system 15 placed at the outlet from the deposition line. The term "quality function" is used herein to mean any mathematical function of one or more quality measurements;
- a second obtaining module 16B configured to obtain a value of said at least one quality function from a value of said at least one quality measurement as measured at the outlet from the deposition line 3 on a stack of thin layers deposited on a transparent substrate, while the deposition line 3 is configured by means of a current value of said at least one operating parameter; and
- an automatic adjustment-determining module 16C configured to use the mathematical model MOD to determine an adjustment value for the current value of said at least one operating parameter for the purpose of reducing a difference that exists between the value obtained for said at least one quality function and a target value selected for that at least one quality function for the stack of thin layers.

It should be observed that in the description a "value" may refer equally well to a single value or to a vector of values. Typically, when considering a plurality of operating parameters (e.g. an operating parameter for each compartment of the deposition line or a plurality of operating parameters for all or some of the compartments of the deposition line), the "value" of said at least one operating parameter is the vector having components that are the values of the various operating parameters under consideration. The same applies when consideration is given to a plurality of quality measurements or a plurality of quality functions.

The functions of the modules 16A-16C of the adjustment-determining device 16 are described in greater detail below with reference to FIG. 4.

Figure 4:
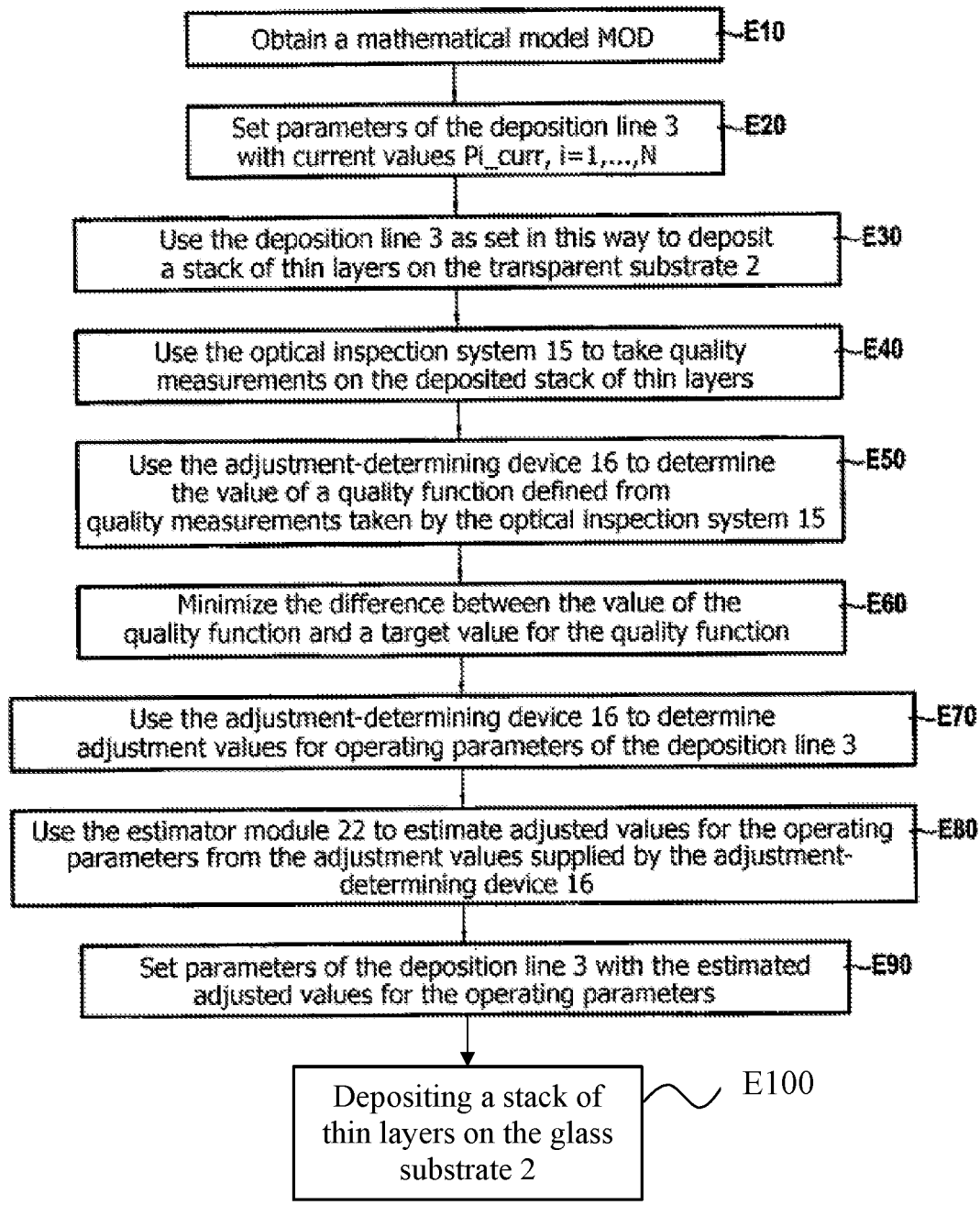
FIG. 4 is a flow chart of a particular implementation showing the main steps of a parameter-setting method of the invention as performed by the FIG. 1 deposition system, and also the main steps of an adjustment-determining method of the invention as performed by the FIG. 3 estimator device.

FIG. 4 is a flow chart showing the main steps of a method of the invention for setting parameters of the deposition line 3 as used by the deposition system 1 in a particular implementation. The parameter-setting method relies on the steps of an adjustment-determining method of the invention performed by the adjustment-determining device 16 of the system 1 in order to determine adjustment values for the operating parameters of the deposition line 3. These adjustment values seek to make it possible to use the deposition line 3 to obtain a stack of thin layers satisfying predetermined characteristics (e.g. layers of predetermined thicknesses with given accuracy, etc.).

As mentioned above, the invention is particularly advantageous in that it determines the adjustment values by relying on a simplified mathematical model MOD. In order to facilitate understanding of the invention, attention is given more particularly to setting the parameters for the powers of the N cathodes in the compartments of the deposition line 3. For this purpose, and by way of illustration, consideration is given to a mathematical model MOD that associates the powers Pi, i=1, ..., N of the N cathodes of the compartments of the deposition line 3 (N operating parameters in the meaning of the invention) with J optical spectra SPj, j=1, ..., J (quality measurements in the meaning of the invention) as measured by the inspection device 15 at the outlet from the deposition line concerning the stack of thin layers it has deposited (possibly at various measurement points distributed over the width of the substrate) when its parameters are set with the current values Pi_curr, i=1, ..., N for the powers of the cathodes.

In the presently-envisaged example, consideration is given to J=3 optical spectra SPj measured by the inspection device 15, each optical spectrum SPj comprising K measurements taken at K different wavelengths: SP1 is an optical spectrum in transmission, SP2 is an optical spectrum in reflection measured on the stack side, and SP3 is an optical spectrum in reflection measured on the transparent substrate side. Each optical spectrum SPj may be represented by a vector having K components.

It is assumed at this point that only one measurement point is taken into consideration for the optical spectra SPj, this measurement point being situated at the center of the substrate in the width direction, for example. The reference SP designates the optical spectrum that is obtained by concatenating the optical spectra SPj, j=1, ..., J. The optical spectrum SP may be represented by a column vector having K×J components corresponding to the K distinct wavelengths considered for each optical spectrum SPj, j=1, ..., J. The spectrum SP corresponds to a quality function in the meaning of the invention defined from the optical spectra SP1, SP2, ..., SPJ that constitute quality measurements in the meaning of the invention.

This quality function considers the quality measurements SP1, SP2, ..., SPJ raw (i.e. they are merely concatenated and they are not modified). In a variant, if a plurality of spectra measurement points SP1, ..., SPJ are envisaged (e.g. taking measurements at the outlet from the deposition line of J spectra at L distinct measurement points distributed over the slab, giving rise to J×L spectra referenced SP1(1) ..., SP1(L), SP2(1), ..., SP2(L) ..., SPJ(1), ..., SPJ(L), with each spectrum SPj(l) constituting a quality measurement in the meaning of the invention), it is possible to envisage for each spectrum type indexed by j, j=1, ..., J, averaging the measurements available at these various measurement points (or values extrapolated from such measurements), so as to obtain J averaged spectra SP1mean=mean(SP1(1), ..., SP1(L)), SP2mean=mean(SP2(1), ..., SP2(L)), ..., SPJmean=mean(SPJ(1), ..., SPJ(L)). In other words, in this example, the quality function corresponds to a concatenation of different types of measured spectra combined with a mean taken for each type of spectrum over all of the measurement points under consideration.

In a variant, it is possible to keep all of the quality measurements that are taken and the optical spectrum SP may be obtained by concatenating the L×J measured optical spectra SP1(1), ..., SP1(L), SP2(1), ..., SP2(L) ..., SPJ(1), ..., SPJ(L).

In the presently-envisaged example and by way of illustration, consideration is given more precisely to the mathematical model MOD relating:

variations relative to reference powers Pi_ref, i=1, ..., N for the powers Pi of the N cathodes of the compartments of the deposition line 3, these variations being written ΔPi, i=1, ..., N and, for simplification, being assumed to be identical for each cathode and equal to x, where x is a real number: and to variations in the optical spectra written ΔSPJ, j=1, ..., J, coming from power variations applied to the N cathodes of the compartments of the deposition line 3.

The advantage of considering a mathematical model that sets up a relationship between the variations in the operating parameters and the variations in the quality measurements is that it makes it possible to ignore various hidden factors that might have an impact on the model, such as for example errors or biases that might affect the optical inspection system 15, etc.

Nevertheless, it should be observed that this example is given purely by way of illustration and does not limit the invention. As mentioned above, the invention applies to other operating parameters of the deposition line 3, to other quality measurements taken at the outlet from the deposition line 3 on the deposited stack of thin layers, to other quality functions, etc. For example, in the quality function it is possible to consider not only the above-mentioned optical spectrum measurements, but also values that are integrated (i.e. obtained) on the basis of the optical spectrum measurements, such as for example color values derived in the known L*a*b* color space (where L* designates lightness, and the components a* and b* characterize the color difference between a point under consideration and the color of a gray surface having the same lightness).

The mathematical model MOD may be obtained in various ways by the adjustment-determining device 16, and more particularly by an obtaining module 16A (step E10). As in the presently-described embodiment, it may be derived upstream from any adjustment of the parameters of the deposition line 3 by the obtaining module 16A of the adjustment-determining device 16 or by some other device, and stored for future use in a memory that it accessible to the obtaining module 16A (e.g. in the non-volatile memory 20 of the adjustment-determining device 16). The adjustment-determining module 16A can then obtain the model MOD when required by accessing the non-volatile memory 20.

In a variant it may be derived on the fly by the obtaining module 16A when adjustment of the parameters of the deposition line 3 is intended and requested, or during the first adjustment that is made and then stored in the non-volatile memory 20. As mentioned in greater detail below, the mathematical model MOD may optionally be updated each time adjustment is requested.

Various types of mathematical model may be envisaged by the obtaining module 16A in accordance with the invention. Thus, by way of example, the mathematical model MOD may be a model that is linear, polynomial, statistical, etc. The relationship established by the mathematical model MOD between the operating parameters and the quality measurements may be of various kinds: specifically, the mathematical model MOD may be a so-called "direct" model that supplies values for the quality functions as a function of values of the operating parameters under consideration, or it may be a so-called "indirect" model that provides values for the operating parameters as a function of values of the quality functions.

In a first implementation, it is envisaged that the obtaining module 16A establishes a mathematical model MOD1 that is linear and direct. Other types of mathematical model are described below for various implementations.

In order to determine (i.e. train) the mathematical model MOD1, the obtaining model 16A uses a set of stacks of thin layers referred to as training layers that are deposited by the deposition line 3. This set of training stacks of thin layers is obtained using the following experimental design:

- for each operating parameter under consideration (specifically each power $P_i$, i=1, ..., N), a reference value written Pi_ref is determined that corresponds to the parameter setting of the deposition line 3 during a reference deposition. By way of example, these reference values are determined experimentally or by experts on the basis of a product that has previously been made and that is of quality that is judged to be satisfactory. By way of example, one possibility for obtaining such a product is to use the methodology of the state of the art as described above, which consists in validating each layer separately;
- using the parameter-setting module 14 to set the parameter for the power Pi, i=1, ..., N for each cathode of the deposition line 3 with the corresponding reference value Pi_ref; then
- for each operating parameter under consideration Pi, i=1, ..., N:
    - determining a variation ±x % to be applied to the reference value Pi_ref (e.g. x=±10%);
    - using the parameter-setting module 14 to set the power parameter Pi for the $i^{th}$ cathode of the deposition line 3 with the value Pi_ref+x %, with the powers Pk, k=1, ..., N, k≠i for the other cathodes being maintained at their reference values Pk_ref; the deposition line 3 is used to deposit a stack of training thin layers corresponding to this parameter setting for the $i^{th}$ cathode, and the optical inspection system 15 is used at the outlet from the deposition line 3 to measure the optical spectra written SPj (Pi_ref+x %), j=1, ..., J of the stack of training thin layers that have been made;
    - thereafter, using the parameter-setting module 14 to set the power parameter Pi of the $i^{th}$ cathode of the deposition line 3 with the value Pi_ref−x %, the powers Pk, k=1, ..., N, k≠i of the other cathodes being maintained at their reference values Pk_ref; the deposition line 3 is used to deposit a training stack of thin layers corresponding to this parameter setting for the $i^{th}$ cathode, and the optical inspection system 15 is used at the outlet from the deposition line 3 to measure the optical spectra SPj(Pi_ref−x %) of the training stacks of thin layers that have been made;
    - storing in the non-volatile memory 20 the spectra SP(Pi_ref+x %) and SP(Pi_ref−x %) that have been obtained by concatenating respectively the J optical spectra SPj (Pi_ref+x %) and SPj (Pi_ref−x %), j=1, ..., J in association with the corresponding variations in the power of the $i^{th}$ cathode (i.e. ±x % relative to Pi_ref).

It should be observed that in the above-described mode of operation each training stack corresponds to varying a single operating parameter at a time, the same for each compartment (i.e. for applying these variations of ±x %, consideration is given to the operating parameters individually and in succession so as to identify individually the contribution of each power variation on the optical spectra measured by the optical inspection system 15). Nevertheless, in another mode of operation, while depositing a training stack of thin layers, it is possible to vary a plurality of operating parameters of the deposition line by a determined quantity simultaneously. In addition, for simplification purposes, this example seeks to vary the reference powers of the various cathodes of the deposition line by the same quantity x % either up or down. Nevertheless, in a variant, it is possible to apply a different quantity for an upward variation and for a downward variation, and to cause that quantity to vary from one cathode to another (in which case x depends on n, n=1, ..., N).

In preferred manner, the variations of ±x % considered about each reference value Pi_ref of the operating parameters are selected so as to conserve the assumption of linearity made in the first implementation concerning variations in the quality measurements as a function of variations in the operating parameters (i.e. x is selected to be large enough to be distinguishable from noise, while retaining the assumption of linearity that is made for the mathematical model). This is illustrated in FIGS. 5A to 5C.

Figure 5A:
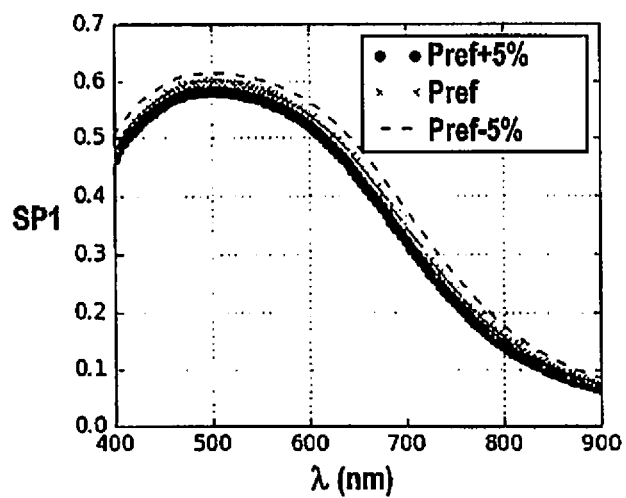
FIGS. 5A-5C show the impact of the variations applied to the operating parameters of a deposition line on the various optical spectra measured on a stack of thin layers produced by that deposition line.
Figure 5B:
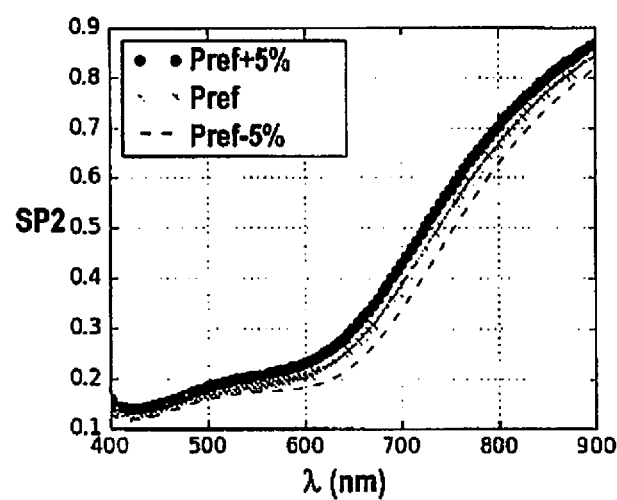
Figure 5C:
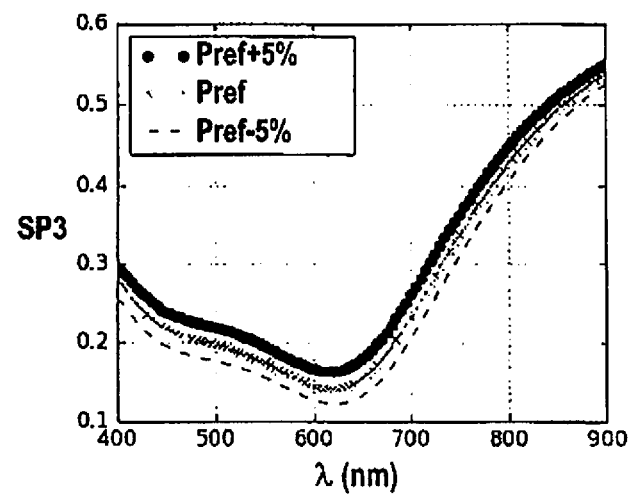

FIGS. 5A, 5B, and 5C show respectively variations observed in the optical spectra as measured in transmission (FIG. 5A) and in reflection (stack side for FIG. 5B and substrate side for FIG. 5C) on a stack of thin layers deposited on a glass substrate of the EX1 type described above, when the reference power for the first silver layer Ag1 is increased or reduced by x=5%. In these figures, it can be seen that the spectra observed at the reference power lie in the middle between the spectra obtained respectively by varying that reference power by ±5%.

From optical spectra stored in the non-volatile memory 20, the obtaining module 16A determines the linear mathematical model MOD1. More precisely, in the first implementation described herein, the obtaining module 16A uses the stored N optical spectra SP(Pi_ref+x %) and SP(Pi_ref−x %), i=1, N to construct a matrix M defining the mathematical model MOD1. For this purpose, the obtaining module 16A evaluates the column vector VARi(x %), i=1, N comprising K×J components for each variation of ±1% in the power Pi_ref of a cathode i of the deposition line, the vector being defined by:

$$VARi(x\%) = [SP(Pi_{ref} + x\%) - SP(Pi_{ref} - x\%)]$$

Thereafter, the obtaining module 16A determines the vector Ui, i=1, ..., N defined by:

$$Ui = \frac{VARi(x\%)}{2x}$$

Thereafter, the obtaining module 16A constructs the matrix M by concatenating the N vectors Ui, i=1, ..., N obtained as follows:

$$M=[U1\ U2\ U3\ \ldots\ UN]$$

with the resulting matrix M having dimensions of (K×J)×N.

This matrix, associated with the reference powers and with the power variations applied to the reference powers, defines the linear mathematical model MOD1.

It should be observed that the person skilled in the art would have no difficulty in deriving such a matrix when different variations ±x(i) % are applied to the reference powers Pi_ref of each cathode, with the same applying if a different quantity is applied for the increase and the decrease relative to the reference power on each cathode.

The obtaining module 16A stores the matrix M in the non-volatile memory 20 as the mathematical model MOD1.

It should be observed that the mathematical model MOD1 can be updated, e.g. from a new set of training stacks, in order to take account of variation in different factors that might affect the quality of the stacks of thin layers made by the deposition line.

It is now assumed that the deposition line 3 is used for depositing an EX1 type stack of thin layers on the glass substrate 2. For this purpose, the operating parameters of the deposition line 3, and more precisely in this example the powers Pi, i=1, ..., N of the N cathodes of the deposition line are adjusted by means of the parameter-setting module 14 to have said current values Pi_curr, i=1, ..., N (step E20). The current values Pi_curr may be selected by an expert or, by way of example, they may correspond to the values used during the last production performed by the deposition line 3.

Once the parameters have been set in this way, the deposition line 3 is activated to deposit a stack of thin layers on the glass substrate 2 (step E30).

After that deposition, the optical inspection system 15 at the outlet of the deposition line 3 takes various quality measurements on the complete stack of thin layers that has been deposited (step E40). In the presently-described example, the quality measurements taken are J optical spectra (said to be "current") SP1_curr, ..., SPJ_curr, as described above (including spectra measurements for K distinct wavelengths). These J optical spectra are supplied by the optical inspection system 15 to the adjustment-determining device 16 (and more precisely to its second obtaining module 16B) (step E50).

In the presently-described example, and as mentioned above, the quality function under consideration corresponds to concatenating the J optical spectra SP1_curr, ..., SPJ_curr (quality measurements in the meaning of the invention) unchanged. The concatenated quality measurements SP1_curr, ..., SPJ_curr for forming the current optical spectrum SP_curr thus together constitute a value of a quality function obtained from current values (corresponding to the J spectra SP1_curr, ..., SPJ_curr) of quality measurements in the meaning of the invention.

Using its automatic adjustment-determining module 16C, the adjustment-determining device 16 then evaluates the difference between the value obtained for the quality function and a target value chosen for that quality function for the stack of thin layers made by the deposition line 3. In the presently-envisaged example, this difference, written v, is a column vector evaluated as follows:

$$V=SP_{targ}-SP\_curr$$

where SP_targ designates the target optical spectrum for the stack of thin layers made by the deposition line corresponding to concatenating J target optical spectra SPj_targ determined for each of the types of optical spectrum under consideration (i.e. in the presently-envisaged example, J=3 for the spectrum in transmission, for the spectrum in reflection on the stack side, and for the spectrum in reflection on the substrate side). These target optical spectra SPj_targ can be determined experimentally from a reference stack of thin layers presenting the characteristics (e.g. in terms of mechanical and/or optical properties, layer thicknesses, etc.) that are expected for that stack.

The adjustment-determining device 16 seeks to minimize, or at least reduce, the difference v observed between the current spectrum and the target spectrum in order to obtain a product at the outlet from the deposition line that complies with certain predetermined properties. For this purpose, the automatic adjustment-determining module 16C uses the digital mathematical model MOD stored in the non-volatile memory 20 to determine the variations in the operating parameters that are to be applied to the current values of the operating parameters to which the deposition line 3 is set in order to minimize (and where possible eliminate) the difference v that is evaluated (step E60). When the mathematical model MOD is a direct model, this adjustment-determining operation requires inverting the mathematical model MOD (giving variations of the quality function as a function to the values of the operating parameters).

In the first implementation in which the mathematical model MOD is the linear model MOD1, this inversion consists more particularly in the adjustment-determining module 16C determining a vector ΔAJ of N adjustment values for the current powers Pi_curr, i=1, ..., N for the cathodes of the deposition line satisfying the following relationship:

$$\Delta AJ = \mathrm{argmin}_{\Delta P}(\|M\Delta P - v\|)$$

where ΔP is the column vector of dimension N for the power variations to be applied to the N cathodes (M designating a matrix having L×J rows and N columns, ΔP is thus a column vector having N dimensions). The quantity ||MΔP−v|| that is to be minimized in order to determine the vector ΔAJ of power adjustment values for the cathodes constitutes a cost function that should be minimized in an attempt to correct the residual difference v between the current optical spectrum SP_curr as measured on the stack at the output from the deposition line and the target optical spectrum SPtarg desired for the stack.

The automatic adjustment-determining module 16C in this example determines the vector ΔAJ by performing the following adjustment-determining calculation (step E70):

$$\Delta AJ = (M^T \cdot M)^{-1} \cdot M^T \cdot v$$

In another implementation, the automatic adjustment-determining module 16C can regularize the inversion. By way of example, this regularization may be Tikhonov regularization that consists in determining a vector ΔAJ of N current power adjustment values Pi_curr, i=1, N for the cathodes of the deposition line, satisfying the following relationship:

$$\Delta AJ = \mathrm{argmin}_{\Delta P}(\|M\Delta P - v\|^2 + \alpha \|\Delta P\|^2)$$

where α designates a regularization parameter. The vector ΔAJ satisfying this relationship can be calculated in deterministic manner by the automatic adjustment-determining module 16C as follows:

$$\Delta AJ = (M^T \cdot M + \alpha I)^{-1} \cdot M^T \cdot v$$

where I designates the identity matrix.

In a variant implementation, the automatic adjustment-determining module 16C performs LASSO regularization, which consists in determining a column vector $\Delta AJ$ of N adjustment values for the current powers Pi_curr, i=1, ..., N for the cathodes of the deposition line satisfying the following relationship:

$$\Delta AJ = \operatorname{argmin}_{\Delta P}(\|M\Delta P - v\|^2 + \alpha \Sigma_i |\Delta Pi|)$$

where $\alpha$ designates a regularization parameter and $\Delta Pi$ the adjustment value applied to the current power for cathode i.

It should be observed that the regularization parameter applied by the automatic adjustment-determining module 16C may be a constant or it may vary over time.

Whatever the cost function that is minimized by the automatic adjustment-determining module 16C (including or not including a regularization term), the vector of adjustment values $\Delta AJ$ determined by the adjustment-determining device 16 is then supplied by that device to the parameter-setting module 14 of the deposition line, and more particularly to its estimator module 22. On the basis of the adjustment values that have been supplied thereto, the estimator module 22 estimates adjusted values for the operating parameters of the deposition line 3 (step E80). In the presently-described example, for each operating parameter that is concerned (i.e. for which a non-zero value has been determined by the adjustment-determining device 16) it adds the adjustment value supplied thereto to the current value of the operating parameter.

Thereafter, the deposition line 3 has its parameters set by the parameter-setting module 14 using the adjusted values for the operating parameters as estimated by the estimator module 22 (step E90).

Once these parameters have been set, the deposition line 3 is activated to deposit a new stack of thin layers on the glass substrate 2 (step E100).

After this new deposition, the deposition system 1 can be activated to reiterate steps E40 to E100 until the difference between the selected target value and the corresponding value of the quality function as estimated from the measured quality values obtained by the optical inspection system 15 at the outlet from the deposition line 3 reaches a value that is below a predetermined threshold.

In a variant, other stop criteria could be envisaged. Thus, the steps of deposition, adjustment-determining, adjustment, and parameter-setting for the deposition line 3 may be performed so long as the adjustment values that are determined for the operating parameters remain below a predetermined threshold (in other words, so long as the adjustment values are sufficiently small, the values of the adjustment parameters are adjusted, but if they do not reach incoherent values greater than the threshold under consideration, adjustment of the operating parameters of the deposition line is stopped). It is also possible to envisage stopping the adjustment of the operating parameters of the deposition line as soon as it is detected that the product 4 coming from the deposition line complies with the desired properties, or with the properties expected by the final user of the product.

It should be observed that in the above-described implementation, the parameters of the deposition line 3 are set during steps E20 and E90 by means of the parameter-setting module 14. Nevertheless, this assumption is not itself limiting, and the invention is equally applicable when the parameters are set, e.g. manually by an operator.

Furthermore, prior to using the mathematical model MOD1, in a particular implementation, it is possible to use dedicated tools to validate the mathematical model MOD1 as obtained by the obtaining module 16A. By way of example, such a tool may proceed in similar or identical manner to that performed by the adjustment-determining device 16 in order to determine adjustment values for the operating parameters on the basis of a test set of observed stacks for which the real adjustment values for application are known, and comparing the adjustment values obtained by using the model MOD1 with those real values. If the values coincide with a certain degree of reliability, then the model MOD1 is validated. If the model is invalidated, then the obtaining module 16A is configured to determine a new mathematical model, e.g. on the basis of a new set of training stacks: this new set of training stacks may correspond in particular to taking account of new variation values x for application to the operating parameters around the reference values.

In the first presently-described implementation, the mathematical model MOD used by the adjustment-determining device 16 for determining the adjustments that are to be made to the operating parameters of the deposition line 3 is a direct linear mathematical model MOD1 associating optical spectrum variations measured at the outlet from the deposition line on the stack of thin layers with the power variations to the cathodes of the deposition line.

As mentioned above, other mathematical models can be envisaged when performing the invention. Typically, types of model other than a linear model can be considered, such as for example a model that is polynomial of degree greater than 1, or models that are obtained by using an automatic statistical training algorithm. The mathematical model taken into consideration may also be direct like the model MOD1, or indirect, i.e. it may supply operating parameter values (e.g. variations relative to a reference value) as a function of quality measurement values (e.g. quality measurement variations).

By way of illustration, a second implementation is envisaged where the mathematical model MOD used by the adjustment-determining device 16 is a direct mathematical model MOD2 obtained by using an automatic statistical training algorithm. In known manner, such an algorithm serves to determine the best function for predicting a variable Y on the basis of a variable X. As in the first implementation, attention is given more particularly to a mathematical model MOD2 that supplies variations under consideration for quality measurements or for quality functions (e.g. variations in optical spectra supplied by the optical inspection system 15 relative to reference spectra) as a function of variations in the operating parameters under consideration (e.g. power variations for the cathodes of the deposition line 3 relative to the reference powers of those cathodes). In this example, determining the direct mathematical model MOD2 then consists in using the automatic training algorithm under consideration to determine the function (e.g. written f) that serves to predict the variations in the optical spectra from variations in the powers of the cathodes.

No limitation is associated with the automatic statistical training algorithm used for determining the direct mathematical model MOD2. Given the looked-for mathematical model, it is nevertheless preferred in this example to select a regressive type supervised statistical training algorithm. By way of example, it may be a ridge regression or a LASSO regression, or a regression of the support vector regression (SVR) type, or a random forest regressor type algorithm. Naturally, other types of statistical training algorithm can be considered as a variant (e.g. neural networks, etc.). The invention is not limited to models that are linear or polynomial.

In known manner, algorithms of this type rely on two stages: a stage of training the mathematical model MOD2, followed by a stage of testing it that seeks to validate the model that was trained during the training stage. These two stages are performed by using a set of observed stacks of thin layers (training stacks of thin layers in the meaning of the invention) that are divided into two sub-sets (e.g. in a 70%/30% proportion), one being for use during the training stage, the other being for use during the test stage. It should be observed that the observed stacks of thin layers that are used for training the mathematical model MOD2 advantageously need not be produced for that purpose, i.e. in application of a predetermined experimental design as for the mathematical model MOD1. They may have been produced in some other context, during previous uses of the deposition line 3 for making stacks of thin layers (i.e. they form part of the production history of the deposition line 3), so long as information is available concerning those stacks about the values of the operating parameters that were applied by the deposition line 3 while they were being produced, together with quality measurements that were measured by the optical inspection system 15 on those stacks on leaving the deposition line 3. This serves advantageously to make it easier to have a large number of observed stacks for training the mathematical model MOD2. In addition, new stack observations may be considered at any time for updating the mathematical model MOD2.

Nevertheless, the inventors have observed that in order to obtain a mathematical model MOD2 that is more pertinent (less noisy), it is possible to ensure that the observed stacks of thin layers that are used for determining the model MOD2 are selected so as to comply with a given distribution of variations about reference values for the operating parameters, e.g. a uniform distribution over ±15%.

In a variant, it is possible to envisage other methods that serve to "clean" the observed set of stacks of thin layers in order to keep only stacks that are pertinent for determining the mathematical model MOD2, such as for example eliminating stacks that correspond to values that are clearly outliers, eliminating data that is redundant or generated during malfunctions of the optical inspection system 15 (where such malfunctions can be detected by knowledge-based tests on the basis of the spectrum values supplied by the optical inspection system 15, for example if they exceed 100%, or by statistical tests, for example by verifying whether the distribution of the spectrum values as supplied does not comply with a given distribution), etc. In another example, it is possible to retain only stacks that were all generated by the deposition line on the same day in order to maximize compatibility between the stacks under consideration, etc.

The way in which the mathematical model MOD2 is determined from a set of observed stacks is not described in detail herein since it is known to the person skilled in the art and it naturally depends on the statistical training algorithm that is used.

It should be observed that using the direct mathematical model MOD2 in the adjustment-determining device 16 in order to determine the adjustment values for the operating parameters of the deposition line requires the model to be inverted, as for the direct mathematical model MOD1. Specifically, during steps E60 and E70, the mathematical model MOD2 is used to determine the variations in the operating parameters that are to be applied to the current values of those parameters in order to minimize the difference v. This is performed by the adjustment-determining module 16C using the statistical training algorithm on the basis of the previously trained model MOD2 in conventional manner (in the example envisaged above, having N operating parameters for adjustment, and reusing the notation described above for the mathematical model MOD1, the vector $\Delta AJ$ of adjustment values for these N operating parameters is the vector $\Delta P$ that minimizes the cost function $v-f(\Delta P)$, where f is the function modeled by the model MOD2.

As mentioned above, it is also possible for the adjustment-determining device 16 to use an indirect mathematical model that supplies values for operating parameters (e.g. variations relative to a reference value) as a function of values of the quality measurements (e.g. variations of the quality measurements).

By way of example, a third example is considered in which the mathematical model MOD used by the adjustment-determining device 16 is an indirect mathematical model MOD3 obtained by using an automatic statistical training algorithm. Attention is given in this example more particularly to a mathematical model MOD3 that supplies variations for the operating parameters under consideration (e.g. the cathode powers of the deposition line 3) as a function of variations in the quality measurements or the quality functions under consideration (e.g. optical spectra supplied by the optical inspection system 15).

No limitation is associated with the automatic statistical training algorithm used for determining the indirect mathematical model MOD3. It is possible to use the same training algorithms as are used for the direct mathematical model MOD2. The same remarks apply likewise to the set of observed stacks taken into consideration for training the model MOD3.

Nevertheless, unlike the direct mathematical models MOD1 and MOD2, it should be observed that the indirect mathematical model MOD3 can be used by the adjustment-determining device 16 in order to determine the values for adjusting the operating parameters of the deposition line without requiring inversion. Knowledge of the difference v suffices for acting directly on the basis of the mathematical model MOD3 to determine the adjustment values for the operating parameters relative to their current values.

In the above-described example having N operating parameters for adjustment P1, ..., PN, and L quality measurements available for the stack taken at L measurement points, this can typically be done by determining the adjustment values for the operating parameters P1, ..., PN that, under constraints H, minimize the cost function fcost as defined as follows:

$$fcost(P1, \ldots, PN) = \sum_{l=1,\ldots,L} dist(q(l) + f(P1, \ldots, PN, l), q_{targ}) + reg(P1, \ldots, PN)$$

where:
- $q(\ell)$ is the quality measurement under consideration measured at the position having index $\ell$ ($q(\ell)$ may be a vector, typically when measuring an optical spectrum, having as many components as there are measured wavelengths);
- qtarg is the looked-for target quality measurement;
- dist(a,b) is the selected distance between two quality measurements a and b;
- reg(P1, ..., PN) is a regularization of the operating parameters that might optionally be taken into consideration;

f(P1, ..., PN, $\ell$) is the effect of adjusting all of the measured parameters at the position having index $\ell$ (it can be assumed that the effect is, or is not, the same over the entire width or surface of the substrate, e.g. when the operating parameters under consideration are the powers of the N cathodes); and H are the constraints imposed on the optimization (e.g. the sum of the quantities of gas for each cathode must be constant).

Whatever the mathematical model MOD used (MOD1, MOD2, MOD3 or some other model), the adjustment-determining device 16 determines the adjustment values for the operating parameters of the deposition line 3 by relying on the following steps:

obtaining values for the quality function(s) from the quality measurements taken at the outlet from the deposition line 3 on a stack of thin layers deposited by the deposition line while the line has its parameters set with current values for the operating parameters; and by means of the mathematical model under consideration (automatically) determining adjustment values for the current values of the operating parameters so as to reduce (ideally to minimize) the difference v existing between the values of the quality function(s) and the target values selected for those quality functions for the stack of thin layers, which determination of adjustment values might possibly include inverting the mathematical model MOD under consideration.

In a particular implementation, the model MOD2 or MOD3 is initially made using the given production history.

Thereafter, it is strengthened in order to improve its accuracy. It could be strengthened equally well on the next occasion such stacks are produced, or by stacks specially made in order to strengthen the model. The choice of stacks to be produced for strengthening the model can be made either by an expert or else by an algorithm. The new stacks could be produced on one or more occasions.

In similar manner, with the model MOD1, the new values for variations x to be applied may be determined by an expert or by an algorithm. The stacks of thin layers generated by such variations can also be produced on one or more occasions.

Whatever the model, the deposition line may be configured or reconfigured either by a human or else automatically by software.

It should be observed that the function, written herein as f, used for selecting said at least one operating parameter of the deposition line with said at least one quality function defined from said at least one quality measurement may be made up from a plurality of functions or may combine a plurality of functions. In order to determine a digital model of the function f, it is possible to determine a digital model separately for each of the plurality of functions from which it is made up, e.g. by statistical training, and then to determine the digital model for the function f by using an appropriate algorithm.

In the presently-described implementation and in the various examples considered for the mathematical model MOD, it is envisaged that the value of an operating parameter should be adjusted for each thin layer (in other words by each compartment of the deposition line, where a single compartment is responsible for depositing a given thin layer of the stack), namely the power of the cathode used in that compartment for depositing a thin layer on the glass substrate 2. Nevertheless, that assumption is not itself limiting.

The invention applies the other operating parameters of the deposition line 3, as mentioned above (e.g. gas compositions, gas pressures, etc.).

Furthermore, in a variant, it is possible for the mathematical model MOD to take into consideration only some of the layers of the stack deposited on the transparent substrate 2 by the deposition line 3 (the other layers being ignored by the model so that the adjustment-determining device does not give adjustment values for the operating parameters of those layers; such "ignored" layers may for example be layers that are very fine or that have no measurable impact on the resulting stack, such as for example "blocker" type layers, etc.), or some of the layers may be grouped together within the mathematical model MOD. Thus, by way of example, if a plurality of cathodes contribute to depositing a single layer, it is possible, in accordance with the invention, to adjust the sum or the mean of the operating parameters corresponding to that plurality of cathodes, and then to adjust the operating parameters of each of the cathodes so as to ensure that the sum of the adjustments or the mean of the adjustments made correspond to the determined adjustment values.

In a FIG. 2 embodiment, all of the compartments of the deposition line are in the same surface treatment machine that is known as a "coater".

In a variant, the compartments of the deposition line may be distributed over a plurality of surface treatment machines, the method thus including passing through air (or returning to the atmosphere) between two machines. In an implementation, the measurement(s) are all taken at the outlet from the deposition line, i.e., when using a plurality of surface treatment machines, at the outlet of the last machine.

In another embodiment, at least one measurement, referred to as an additional measurement, can be performed in situ, in other words inside the deposition line, before making the last thin layer in the last machine. In this implementation of the invention, additional measurements are not taken after making each thin layer, given that a said thin layer may possibly be obtained on a plurality of occasions, in other words by a plurality of compartments depositing the same material.

In the context of the invention, it is possible to use a model that is specific to each surface treatment machine, or to use the same model for a plurality of surface treatment machines.

In the same manner, it is possible to use a model that is specific to each product or to use one model for a plurality of different products.

In a particular implementation, the value of the quality function is obtained from quality measurements taken at different points across the entire width or surface of the substrate. This implementation serves to discover the parameter(s) for modification (e.g. in order to adjust the thickness of at least one layer), for all or for some of the thin layers across the entire width or surface of those layers so as to comply with the properties desired at all points of the slab.

When it is desired to obtain a uniform thickness for a given layer, it is possible to control the valves so as to produce different gas flow rates over localized zones of the substrate.

The invention claimed is:

1. An adjustment-determining method for automatically determining an adjustment value for at least one operating parameter of a deposition line for depositing a stack of thin layers on a glass or polymeric organic transparent substrate, the deposition line including at least two separate deposition compartments each depositing a separate thin layer of the stack of thin layers, the method being performed by a computer and comprising:
  obtaining a mathematical model relating at least one operating parameter of the deposition line to at least one predetermined quality function defined from at least one quality measurement of said stack of thin layers deposited by the deposition line, the at least one predetermined quality function being defined without relying on a measurement in any of the at least two separate deposition compartments;
  obtaining a value of said at least one quality function from a value of said at least one quality measurement measured at the outlet of the deposition line on said stack of thin layers deposited by the deposition line on said glass or polymeric organic transparent substrate while the deposition line was set so that at least one operating parameter had a current value; and
  automatic adjustment-determining, using the mathematical model, an adjustment value for the current value of said at least one operating parameter serving to reduce a difference that exists between the value obtained for said at least one quality function and a target value selected for said at least one quality function for the stack of thin layers,
  wherein the value of the at least one quality function is obtained from quality measurements taken at different points across the entire width or surface of the substrate,
  wherein said obtaining the mathematical model comprises:
  obtaining a reference value for said at least one operating parameter corresponding to a setting of the deposition line while performing a reference deposition of a stack of thin layers on a substrate;
  for a plurality of training stacks of thin layers deposited by the deposition line on a substrate while said deposition line is set with values of said at least one operating parameter presenting determined variations relative to said reference value, obtaining a plurality of values for said at least one quality function, and
  determining the mathematical model from the plurality of values for said at least one quality function as obtained for the plurality of training stacks of thin layers, and
  wherein the deposition line has N deposition compartments, N being an integer greater than 1, each deposition compartment being associated with a respective operating parameter P(n), n=1, . . . , N, and the mathematical model is a linear model using a matrix written M and comprising N columns u(n), each column being defined by:

$$u(n) = \frac{1}{2 \times \delta(n)} \text{var}(n)$$

where var(n) designates the difference between the values of said at least one quality function obtained for two training stacks of thin layers deposited by the deposition line while it was set with a value for the operating parameter P(n) presenting a variation +δ (n) relative to the reference value for the operating parameter P(n) and to a value of the operating parameter P(n) presenting a variation −δ (n) relative to the reference value for the operating parameter P(n).

2. The adjustment-determining method according to claim 1, wherein a plurality of operating parameters are adjusted.

3. The adjustment-determining method according to claim 1, wherein the mathematical model relates at least one variation of said at least one operating parameter to at least one variation of said quality function.

4. The adjustment-determining method according to claim 1, wherein said deposition line performs a cathode sputtering technique for depositing the stack of thin layers on the transparent substrate.

5. The adjustment-determining method according to claim 4, wherein said cathode sputtering is magnetic field assisted.

6. The adjustment-determining method according to claim 1, wherein said at least one quality measurement comprises at least one optical spectrum measurement of the stack of thin layers.

7. The adjustment-determining method according to claim 6, wherein said at least one quality measurement further comprises at least one measurement selected from:
  measuring an electrical property of the stack of thin layers;
  measuring a mechanical property of the stack of thin layers;
  measuring a chemical property of the stack of thin layers; and
  measuring a weight property of the stack of thin layers.

8. The adjustment-determining method according to claim 1, wherein said at least one operating parameter comprises:
  at least one power or voltage applied to a cathode of one of said deposition compartments of the deposition line; and/or
  at least one travel speed of the substrate past a cathode of one of said deposition compartments of a deposition line; and/or
  at least one pressure and/or quantity of gas used in one of said deposition compartments of the deposition line; and/or
  at least one magnetic field or magnetic field distribution applied in one of said deposition compartments of the deposition line; and/or
  at least one adjustment of a mechanical element of one of said deposition compartments of the deposition line.

9. The adjustment-determining method according to claim 1, wherein the adjustment value a of said at least one operating parameter is given by:

$$a = (M^T M)^{-1} M^T v$$

where v designates the difference between the value obtained for the quality function and the target value selected for said quality function for the stack of thin layers, and where $M^T$ designates the transpose of the matrix M.

10. The adjustment-determining method according to claim 1, wherein said mathematical model is obtained by using an automatic statistical training algorithm.

11. The adjustment-determining method according to claim 1, further comprising validating the mathematical model that is obtained.

12. A non-transitory computer-readable data medium storing a computer program including instructions for executing steps of the adjustment-determining method according to claim 1 when said program is executed by a computer.

13. A deposition system for depositing a stack of thin layers on a transparent substrate, the system comprising:
  a deposition line configured to deposit a stack of thin layers on a transparent substrate;

a parameter-setting module configured to set at least one operating parameter of the deposition line with a current value;

an adjustment-determining device according to claim 12 for automatically determining an adjustment value for the current value of said at least one operating parameter configured to use a value of at least one quality measurement measured at the outlet of the deposition line on a stack of thin layers deposited on the transparent substrate by the deposition line; and an estimator module configured to estimate an adjusted value for said at least one operating parameter from the current value and from the adjustment value determined by the adjustment-determining device;

the parameter-setting module being configured to set at least one operating parameter of the deposition line with the adjusted value as estimated by the estimator module.

14. A parameter-setting method for setting parameters of a deposition line suitable for depositing a stack of thin layers on a transparent substrate, the method being performed by a computer and comprising:

first setting at least one operating parameter of the deposition line with a current value;

depositing, with the deposition line set with said current value, a stack of thin layers on a substrate;

adjustment-determining an adjustment value for the current value of said at least one operating parameter by performing an adjustment-determining method according to claim 1 and by using a value for said at least one quality measurement as measured at the outlet of the deposition line on the stack of thin layers deposited during the depositing;

estimating an adjusted value for said at least one operating parameter from the current value and from the determined adjustment value; and second setting the at least one operating parameter of the deposition line with the adjusted value as estimated during the estimating.

15. The parameter-setting method according to claim 14, wherein the depositing, adjustment-determining, estimating, and second setting are performed so long as:

the difference between the value of the quality function estimated from said measured value at the outlet from the deposition line and the target value selected for said quality function is greater than a predetermined threshold; or the adjustment value determined for said at least one operating parameter is less than a predetermined threshold.

16. An adjustment-determining device for automatically determining an adjustment value for at least one operating parameter of a deposition line for depositing a stack of thin layers on a transparent substrate, the deposition line including at least two separate deposition compartments each depositing a separate thin layer of the stack of thin layers, the device comprising:

a processor and a non-transitory computer-readable data medium storing a computer program that includes instructions for, when said program is executed by the processor:

obtaining a mathematical model relating at least one operating parameter of the deposition line to at least one predetermined quality function defined from at least one quality measurement of said stack of thin layers deposited by the deposition line, the at least one predetermined quality function being defined without relying on a measurement in any of the at least two separate deposition compartments;

obtaining a value of said at least one quality function from a value of said at least one quality measurement measured at the outlet of the deposition line on said stack of thin layers deposited on said transparent substrate, said deposition line being configured by a current value for said at least one operating parameter; and determining automatically, using a mathematical model as obtained, an adjustment value for the current value of said at least one operating parameter serving to reduce a difference that exists between the value obtained for said at least one quality function and a target value selected for said at least one quality function for the stack of thin layers, and a communication system to receive the at least one quality measurement measured by an inspection system and to communicate the adjustment value to the deposition line, wherein the value of the at least one quality function is obtained from quality measurements taken at different points across the entire width or surface of the substrate, wherein said obtaining the mathematical model comprises:

obtaining a reference value for said at least one operating parameter corresponding to a setting of the deposition line while performing a reference deposition of a stack of thin layers on a substrate;

for a plurality of training stacks of thin layers deposited by the deposition line on a substrate while said deposition line is set with values of said at least one operating parameter presenting determined variations relative to said reference value, obtaining a plurality of values for said at least one quality function, and determining the mathematical model from the plurality of values for said at least one quality function as obtained for the plurality of training stacks of thin layers, and wherein the deposition line has N deposition compartments, N being an integer greater than 1, each deposition compartment being associated with a respective operating parameter P(n), n=1, . . . , N, and the mathematical model is a linear model using a matrix written M and comprising N columns u(n), each column being defined by:

$$u(n) = \frac{1}{2 \times \delta(n)} \text{var}(n)$$

where var(n) designates the difference between the values of said at least one quality function obtained for two training stacks of thin layers deposited by the deposition line while it was set with a value for the operating parameter P(n) presenting a variation $+\delta$ (n) relative to the reference value for the operating parameter P(n) and to a value of the operating parameter P(n) presenting a variation $-\delta$ (n) relative to the reference value for the operating parameter P(n).

\* \* \* \* \*